United States Patent [19]

Sakurai

[11] Patent Number: 4,523,298
[45] Date of Patent: Jun. 11, 1985

[54] INPUT DEVICE WITH A KEYBOARD IN WHICH ACTUATION OF A KEY MORE THAN ONCE MAY CAUSE A DIFFERENT FUNCTION TO BE PERFORMED

[75] Inventor: Atsushi Sakurai, Yokohama, Japan
[73] Assignee: Canon Kabushiki Kaisha, Tokyo, Japan
[21] Appl. No.: 498,677
[22] Filed: May 31, 1983

Related U.S. Application Data

[63] Continuation of Ser. No. 133,504, Mar. 24, 1980, abandoned.

[30] Foreign Application Priority Data

Mar. 28, 1979 [JP] Japan .................................. 54-35429

[51] Int. Cl.³ ............................................. G06F 15/02
[52] U.S. Cl. ................................. 364/900; 340/365 S
[58] Field of Search ... 364/200 MS File, 900 MS File, 364/706, 716, 551, 412, 410, 411; 360/709; 340/365 R, 365 S, 692; 179/90 K

[56] References Cited

U.S. PATENT DOCUMENTS

| 3,967,273 | 6/1976 | Knowlton | 179/90 K |
|---|---|---|---|
| 3,978,328 | 8/1976 | Fabry et al. | 364/900 |
| 4,037,092 | 7/1977 | Osborne et al. | 364/706 |
| 4,178,633 | 12/1979 | Olander, Jr. et al. | 364/709 |
| 4,280,121 | 6/1981 | Crask | 364/706 |
| 4,291,385 | 9/1981 | Osborne et al. | 364/709 |
| 4,296,409 | 10/1981 | Whitaker et al. | 364/551 |
| 4,301,511 | 11/1981 | Shimizu et al. | 364/706 |
| 4,339,134 | 7/1982 | Macheez | 364/412 |
| 4,343,990 | 8/1982 | Ueda | 340/692 |
| 4,348,744 | 9/1982 | Waite | 364/410 |
| 4,367,526 | 1/1983 | McGeary et al. | 340/323 R |
| 4,398,720 | 8/1983 | Jones et al. | 364/410 |
| 4,416,182 | 11/1983 | Wise et al. | 364/411 |

Primary Examiner—Gareth D. Shaw
Assistant Examiner—Daniel K. Dorsey
Attorney, Agent, or Firm—Fitzpatrick, Cella, Harper & Scinto

[57] ABSTRACT

An input device for a data processor is provided with an input circuit having input keys to designate two or more kinds of functions, an operation unit to perform operational processing in accordance with function inputs from the input circuit, an auxiliary memory to store therein a state of the operation unit, and a memory for a function table wherein the function to be carried out by the operation unit and the state of the operation unit, to which it is to be shifted after completion of the functions, have been previously written in an address to be determined by combination of the input key and the stored contents of the auxiliary memory. One of the two or more kinds of functions assigned to an input key is selectively introduced into the operation unit by the abovementioned input key.

14 Claims, 5 Drawing Figures

FIG. 1
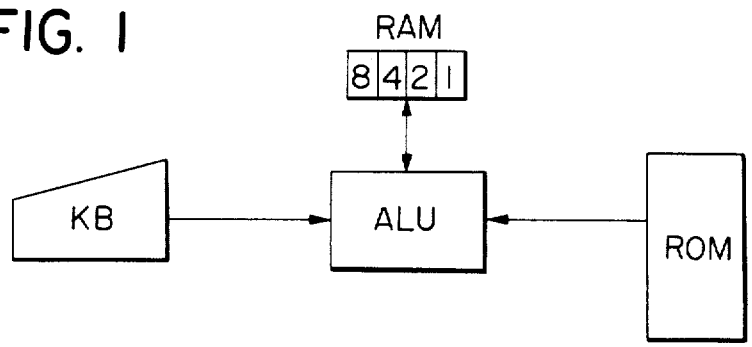
FIG. 2
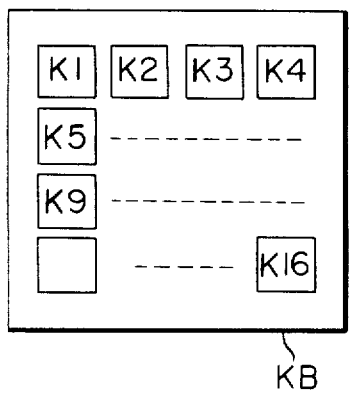
FIG. 3
| ROM (Ki, x) | FUNCTION | STATUS |
|---|---|---|
| (K1, 0) | a | 3 |
| (K1, 1) | b | 9 |
| (K1, 2) | c | 15 |
| (K5, 0) | a | 1 |
| (K5, 1) | b | 0 |
| (K5, 2) | | |
| (K9, 0) | b | 0 |
| (K9, 1) | a | 1 |
| (K9, 2) | | |
FIG. 4A
FIG. 4B
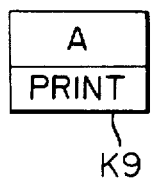

4,523,298

INPUT DEVICE WITH A KEYBOARD IN WHICH ACTUATION OF A KEY MORE THAN ONCE MAY CAUSE A DIFFERENT FUNCTION TO BE PERFORMED

This application is a continuation of application Ser. No. 133,504 filed Mar. 24, 1980, now abandoned.

BACKGROUND OF THE INVENTION

1. Field of the Invention

This invention relates to an input device capable of introducing a plurality of function inputs into a data processor by operation of ordinary input keys.

2. Description of Prior Arts

In the input device for conventional computer systems where a plurality of functions are assigned to a single input key, double operations are required to select one function out of a plurality of functions with another key so as to introduce such one function input into the system, with the consequence that the number of key operations increases and the circuit construction becomes increasingly complicated.

SUMMARY OF THE INVENTION

It is an object of the present invention to provide an input device which solves the abovementioned defect inherent is the conventional input device, wherein a function is made selectively introducible by an input key assigned with a plurality of functions without the necessity for operating any special input means.

According to the present invention, generally, there is provided an input device for a data processor, comprising: a plurality of keys to instruct the input of functions into the data processor; a state memory which stores therein information on the processing state of the data processor; a memory which stores therein pieces of processing state information of the state memory, a plurality of functions to be called upon and instructed for input by the keys, and pieces of processing state information to be newly stored in the state memory; and control means which renders accessible the abovementioned memory based on the combination of the keys and the pieces of processing state information stored in the state memory, and produces as outputs each one of the function and the processing state information out of a plurality of such functions and pieces of processing state information, and stores new pieces of processing state information in the state memory.

The foregoing object, and other objects as well as the detailed construction and function of the input device according to the present invention will be more apparent from the following description of a preferred embodiment thereof when read in conjunction with the accompanying drawings.

BRIEF DESCRIPTION OF THE DRAWINGS

FIG. 1 is a schematic block diagram showing one embodiment of the input device according to the present invention;

FIG. 2 is a diagram showing one example of a layout of the input keys;

FIG. 3 is an explanatory diagram of a function table; and

FIG. 4A and 4B are diagrams showing examples of the input keys.

DETAILED DESCRIPTION OF THE PREFERRED EMBODIMENT

FIG. 1 shows one embodiment of a computer provided with the input device according to the present invention, which is essentially constructed with a key input device KB having a plurality of input keys such as 16 input keys K1, K2, ... K16 arranged in a manner as shown in FIG. 2; an operation unit ALU, which renders accessible a memory based on the input keys and pieces of processing state information stored in a state memory of an auxiliary memory to be described later, produces as outputs each one of the function and the processing state information out of the abovementioned plurality of functions and pieces of processing state information, and stores new pieces of processing state information in the auxiliary memory; the auxiliary memory RAM to maintain the state of ALU (i.e., a "status memory" for storing information as to the status of the apparatus herein described); and a read-only memory ROM which is coupled with the operation unit ALU and stores therein a function table, in which the functions to be carried out by the operation unit ALU have been assigned in advance on the basis of the input states of the input keys K1 to K16 on the key input device KB and the memory state of the auxiliary memory RAM.

The auxiliary memory RAM as herein used has a memory capacity of, for example, 4 bits, and maintains 16 modes (0 to 15) of the operation unit ALU. The read-only memory ROM contains therein a function table, in which the execution functions of the operation unit ALU, each being assigned to each of the total 256 kinds of input information to be determined by the 16 input keys K1 to K16 on the key input device KB and the 16 modes (0 to 15) which the auxiliary memory RAM maintains, have been written. One example of such a function table is illustrated in FIG. 3, wherein the functions to be carried out by the operation unit ALU and the states, to which the operation unit ALU is to be shifted after its execution of the designated function, are written in a ROM address to be determined by combination of the input key Ki (i = 1 to 16) and each state x (x = 0 to 15). For example, if it is assumed that the input key which has been depressed is "K1", for example, and the content of RAM at this time is "1", the state of ALU is "1". Therefore, for the ROM address to be determined by the combination of (K1, 1) the second position from the top of the function table in FIG. 3 is designated. Consequently, the operation unit ALU reads out the function (or "operational signal") b from the ROM function table to execute the same, and then reads out the state "9" corresponding to the function to write the value "9" in the auxiliary memory RAM. In other words, by the input of the key K1, the function b is carried out, and the state of ALU changes from "1" to "9".

In the following, explanations will be made as to the operation for carrying out the function in the operation unit ALU when two keys, e.g., the keys K5 and K9, on the key input device KB are depressed in a certain sequence. Here, the surfaces of the keys K5 and K9 are divided into the upper and lower portions as shown in FIGS. 4A and 4B, the key K5 having a symbol (") in its upper portion and a symbol (") in its lower portion, while the key K9 having a letter (A) in its upper portion and a word (PRINT) in its lower portion. In the operation unit ALU, when a certain function is to be selected from the content of RAM and the function table to ROM with respect to these key inputs, if the function as selected from the function table in FIG. 3 is a, the character in the upper portion of the key is generated, while the character in the lower portion of the key is generated, if the selected function is b.

Now assume that, when the content of RAM is "0", the above-mentioned keys K5 and K9 in the key input device KB are depressed in the sequence of K9, K5, K9, K9, K5. Then, the operation unit ALU performs the data processing as mentioned below.

(1) The initial key input (K9):

The address (K9, 0) on the function table is determined on the basis of the combination of the key K9 and the content of RAM of "0". Since the function in this address is b according to the example shown in FIG. 3, the operation unit ALU generates the word (PRINT) in the lower portion of the key K9. Subsequently, the shifting state "0" is read out of the function table, and the content "0" is stored in RAM.

(2) The second key input (K5):

Based on combination of the key K5 and the content of RAM of "0", the address (K5, 0) on the function table is determined, whereby the function a is selected as shown in FIG. 3, and the operation unit ALU carries out the function a to generate the character ("). Subsequently, the state "1" is read out of the function table and stored in RAM.

(3) The third key input (K9):

The ROM address (K9, 1) is determined in the manner as mentioned above, and the operation unit ALU carries out the function a to generate the character (A). The state "1" is then read out of the function table and stored in RAM.

(4) The fourth key input (K9):

In the same manner as in the abovementioned third key input, the ROM address (K9, 1) is selected, and the operation unit ALU carries out the same function to generate the character (A). The content of RAM remains "1".

(5) The fifth and last key input (K5):

The address (K5, 1) is determined by the key input K5, and the operation unit ALU carries out the function b to generate the symbol ("). Then, the state "0" is read out of the function table and stored in RAM.

In the manner as mentioned in the foregoing, the word (PRINT) and the letter (A) are generated by the sequential key input by the input keys K9, K5, K9, K9 and K5.

Incidentally, in the above-described embodiment, two functions are allotted to each key, although the present invention is not limited to this mode alone, but three or more functions may be assigned to each key and the contents of the function table can be prepared in advance in conformity to such functions.

Thus, according to the present invention, it is possible to perform multifunction input operations by the operation of ordinary input keys, so that complicacy in the key operation as well as intricacy in the circuit construction which have so far been considered a defect in this kind of input device, can be solved.

What I claim is:

1. An input device, comprising:
   keyboard means having a plurality of input keys, at least one of said input keys being assigned more than one function and the actuation of said one input key more than once in a sequence of actuations performing a function different from that performed by the first actuation thereof;
   first memory means for storing status data for said one input key;
   second memory means for storing next status data for replacing the status data in said first memory means; and
   process means for generating input information as a function of a combination of the status data from said first memory means and actuation of said one input key from among said plurality of input keys, said process means supplying the next status data in said second memory means to said first memory means in accordance with the combination of the operated input key and the status data in said first memory means whereby the previous status data stored in said first memory means is replaced by the next status data so that said one operated input key performs different functions when actuated more than once in a sequence of actuations.

2. An input device according to claim 1, further comprising means for transmitting the next status data read out from said second memory means to said first memory means.

3. An input device according to claim 1, wherein said second memory means comprises a memory area for storing a plurality of next status data.

4. An input device according to claim 1, wherein said second memory means comprises a read-only memory.

5. An input device, comprising:
   keyboard means having a plurality of input keys, at least one of said input keys being assigned more than one function and the actuation of said one input key more than once in a sequence of actuations performing a function different from that performed by the first actuation thereof;
   process means for executing a process in response to an operation of any one of said plurality of input keys;
   memory means for storing status data at least for said one input key; and
   process-table memory means for storing, at an address, a next status data for replacing the previous status data in said memory means, and function data for controlling the execution of the process by said process means,
   said process means supplying said next status data stored in the address in said process-table memory means to said memory means in accordance with a combination of actuation of said one input key and the previous status data in said memory means after said process means has executed the process in accordance with function data associated with said one input key, whereby the previous status data stored in said memory means is replaced by the next status data so that said one operated input key performs different functions when actuated more than once in a sequence of actuations.

6. An input device according to claim 5, further comprising means for transmitting the next status data stored in the address of said process-table memory means to replace the previous status data in said memory means.

7. An input device according to claim 5, wherein said process-table memory means includes a read-only-memory.

8. An input device according to claim 5, further comprising means for transmitting the function data stored in said process-table memory means to said processing means.

9. A data processing device, comprising:

keyboard means having a plurality of input keys for entering characters, symbols or functions or the like into said device, said input keys being assigned more than one function and actuation of each said input key more than once in a sequence of actuations performing a function different from that performed by the first actuation thereof;

first memory means for storing status information for each of said input keys;

second memory means for storing said characters, symbols or functions or the like associated with said plurality of input keys and next status information associated with said characters, symbols or functions or the like; and process means for, when one of said input keys has been actuated, reading out said characters, symbols, functions or the like from said second memory means on the basis of said operated input key and said status information in said first memory means and writing said next status information from said second memory means into said first memory means whereby the previous status data stored in said first memory means is replaced by the next status data so that said one operated input key performs different functions when actuated more than once in a sequence of actuations.

10. A data processing device according to claim 9, further comprising means for transmitting the next status data in said second memory means into said first memory means.

11. A data processing device according to claim 9, wherein said second memory means includes a read-only-memory.

12. A data processing device according to claim 9, further comprising processing means for executing a process in accordance with the function instruction stored in said second memory means.

13. A data processing device, comprising:

keyboard means having a plurality of input keys, at least one of said input keys being assigned more than one function and the actuation of said one input key more than once in a sequence of actuations performing a function different from that performed by the first actuation thereof;

first memory means for storing state data; and second memory means for storing, in an address, next status data for replacing the status data in said first memory means;

wherein the next status data in the address in said second memory means is supplied to said first memory means after utilization of a function instruction for controlling operation of said data processing device, and wherein the address is selected in accordance with a combination of the one operated input key and the previous status data in said first memory means, whereby the previous status data stored in said first memory means is replaced by the next status data so that said one operated input key performs different functions when actuated more than once in a sequence of actuations.

14. A data processing device according to claim 13, further comprising means for transmitting the next status data stored in the address of said second memory means to said first memory means.

* * * * *